United States Patent
Keyser (10) Patent No.: US 7,838,324 B2
(45) Date of Patent: Nov. 23, 2010

(54) NEUTRON DETECTION STRUCTURE AND METHOD OF FABRICATING

(75) Inventor: Thomas R Keyser, Plymouth, MN (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 12/340,106

(22) Filed: Dec. 19, 2008

(65) Prior Publication Data

US 2010/0159671 A1 Jun. 24, 2010

(51) Int. Cl.
*H01L 21/00* (2006.01)

(52) U.S. Cl. .......................... 438/56; 438/57; 438/59; 438/62; 257/E21.422; 257/E21.575; 257/E32.091

(58) Field of Classification Search ............. 438/56–62; 257/E21.422, 575, E31.091
See application file for complete search history.

(56) References Cited

U.S. PATENT DOCUMENTS

| | | | |
|---|---|---|---|
| 5,281,822 A | | 1/1994 | Albrecht et al. |
| 5,319,210 A | | 6/1994 | Moscovitch |
| 5,430,777 A | * | 7/1995 | Burel .................... 376/154 |
| 5,444,301 A | | 8/1995 | Song et al. |
| 6,075,261 A | * | 6/2000 | Hossain et al. ............. 257/252 |
| 6,545,281 B1 | * | 4/2003 | McGregor et al. ..... 250/370.05 |
| 6,765,978 B1 | | 7/2004 | Kronenberg et al. |
| 6,771,730 B1 | | 8/2004 | Dowben |
| 6,841,841 B1 | | 1/2005 | Blish, II et al. |
| 6,867,444 B1 | | 3/2005 | Hughes |
| 6,909,159 B2 | | 6/2005 | Friend et al. |
| 7,265,359 B2 | | 9/2007 | Ambrosi et al. |
| 7,271,389 B2 | | 9/2007 | August et al. |
| 7,332,726 B2 | | 2/2008 | Friedman |
| 7,335,891 B2 | | 2/2008 | Kniss et al. |
| 7,491,948 B2 | | 2/2009 | Gordon |
| 2004/0227094 A1 | | 11/2004 | Tompa et al. |

(Continued)

FOREIGN PATENT DOCUMENTS

WO 2005/088719 A1 9/2005

(Continued)

OTHER PUBLICATIONS

Barthe, Jean. "Electronic Dosimeters Based on Solid State Detectors," Nuclear Instruments and Methods in Physics Research B 184 (2001) 158-189, 2001 Elsevier B.V.

(Continued)

*Primary Examiner*—Michael S Lebentritt
(74) *Attorney, Agent, or Firm*—Shumaker & Sieffert, P.A.

(57) ABSTRACT

A method of fabricating a neutron detection structure includes temporarily bonding a carrier to a passivated SOI SRAM wafer, removing a first substrate, depositing a conversion layer where at least a portion of the first substrate was removed, permanently bonding a second substrate to the conversion layer, removing the carrier, and providing at least one electrical contact to the device layer. A method of fabricating a neutron detection structure, corresponding to an alternate embodiment, includes temporarily bonding a carrier to a passivated SOI SRAM wafer, removing a first substrate, depositing a conversion layer onto a second substrate, permanently bonding the coated substrate where at least a portion of the first substrate was removed, removing the carrier, and providing at least one electrical contact to the device layer.

20 Claims, 7 Drawing Sheets

U.S. PATENT DOCUMENTS

| | | |
|---|---|---|
| 2005/0071730 A1 | 3/2005 | Moyer |
| 2005/0082489 A1* | 4/2005 | August et al. .......... 250/370.05 |
| 2006/0157654 A1* | 7/2006 | Frank .................... 250/370.05 |
| 2008/0017804 A1 | 1/2008 | Krishnamoorthy et al. |
| 2008/0165605 A1 | 7/2008 | Fisch |
| 2008/0308747 A1 | 12/2008 | Gordon |
| 2009/0302227 A1* | 12/2009 | Keyser et al. .......... 250/370.05 |

FOREIGN PATENT DOCUMENTS

| | | |
|---|---|---|
| WO | 2006/085307 A1 | 8/2006 |
| WO | 2005/076779 A1 | 8/2008 |

OTHER PUBLICATIONS

Bartlett et al., "Action Neutron Personal Dosemeters—A Review of Current Status," Radiation Protection Dosimetry, vol. 86, No. 2, pp. 107-122 (1999) Nuclear Technology Publishing.

J.C. Lund, F. Sinclair & G. Entine, Neutron Dosimeter Using a Dynamic Random Access Memory as a Sensor, 33 IEEE Transactions on Nuclear Science, Feb. 1986.

* cited by examiner

NEUTRON DETECTION STRUCTURE AND METHOD OF FABRICATING

FIELD

The present invention relates to a method of fabricating a structure for providing sensitive detection capability for neutrons, and more particularly, to a neutron detection structure capable of implementation in a mass-produced device.

BACKGROUND

Large numbers of cargo containers, ships, and planes are received at shipping ports, borders, and transportation centers each day and each one presents a potential opportunity for unauthorized delivery of a nuclear device, such as a radiological weapon (e.g. a small dirty bomb). In addition, smuggling of devices out of a location is also a concern in order to keep terrorists and other unauthorized entities from obtaining such devices.

While many types of radiation detectors have been developed, one of the more promising types appears to be a Silicon-On-Insulator (SOI) Static Random Access Memory (SRAM) structure used in conjunction with one or more neutron conversion layers, such as those doped with boron (e.g. boron-10). For example, U.S. Pat. Nos. 6,867,444 and 7,271,389, assigned to the United States Navy, set forth two such devices and are hereby incorporated by reference herein in their entireties. However, these devices require substrates with a heavily doped buried layer, which is complicated to prepare and process. Post-circuit processing is also made difficult due to the conversion layer being buried in the substrate.

Therefore, a neutron detection structure that is easily manufacturable and utilizes commercially available SOI SRAMs would be desirable. The structure should allow for unattended detection of neutrons emitted from small nuclear devices, for example.

SUMMARY

A neutron detection structure built from a Silicon-On-Insulator memory cell includes a conversion layer for converting incident neutrons into emitted charged particles, a device layer for receiving the emitted charged particles, a buried oxide layer separating the conversion layer from the device layer and directly adjacent to the conversion layer and the device layer, an isolation layer, a passivation layer formed on the isolation layer opposite the device layer and buried oxide layer, and a plurality of conductive contacts to provide electrical contact to the device layer.

A method in accordance with a first embodiment for fabricating such a structure includes temporarily bonding a carrier to a passivated SOI SRAM wafer, removing a first substrate, depositing a conversion layer where at least a portion of the first substrate was removed, permanently bonding a second substrate to the conversion layer with an optional adhesive layer, removing the carrier, and providing at least one electrical contact to the device layer.

A method in accordance with a second embodiment for fabricating a neutron detection structure includes temporarily bonding a carrier to a passivated SOI SRAM wafer, removing a first substrate, depositing a conversion layer onto a second substrate forming a coated substrate, permanently bonding the coated substrate where at least a portion of the first substrate was removed with an optional adhesive layer, removing the carrier, and providing at least one electrical contact to the device layer.

DETAILED DESCRIPTION OF PRESENTLY PREFERRED EMBODIMENTS

Introduction

The embodiments described herein provide sensitive detection capabilities for neutrons, one of the decay products of the fissionable material used in a nuclear device. The underlying detection technology is described in further detail in U.S. Pat. Nos. 6,867,444 and 7,271,389, both of which are incorporated by reference herein in their entireties. In accordance with the present embodiments, a structure for implementing a proposed neutron detection film stack and a method that allows for mass-production of the device is set forth.

In general, the device is fabricated from an SOI CMOS SRAM circuit configured to count alpha-particle induced upsets. Low temperature wafer bonding, wafer thinning, and back side processing techniques are used to create a finished device comprising a neutron conversion film sandwiched between a thin SRAM device and a substrate. Conductive wires or bumps can be used to connect the device to package leads.

A method, according to a first embodiment, for fabricating the preferred structure starts by first temporarily bonding an inert carrier substrate to the surface of a completed IC wafer using known low-temperature bonding methods. The original substrate is then removed from the IC layer by grinding, polishing, and chemically etching the silicon to expose the underside of the buried oxide layer. An equivalent structure can be formed using a "debondable" SOI wafer to transfer the active device layer onto a suitable carrier. Debondable SOI wafers have been described by Tracit, a subsidiary of SOI-TEC.

A neutron conversion layer consisting of a low-temperature, B 10-doped spin-on dielectric is subsequently deposited onto the exposed buried oxide surface at temperatures that do not degrade the integrity of the temporary adhesive holding the device wafer to the sacrificial carrier. A second substrate is permanently bonded to the conversion layer either by bringing the substrate wafer in contact with the uncured spin-on conversion layer, which acts as an adhesive, or by applying a layer of adhesive material to form the bond. The carrier wafer is then removed by breaking the temporary bond exposing the top surface of the device. Openings in the surface can then be created (such as by an etching process) to provide access to top-side circuit interconnect pads. The device is then be cured to increase the strength of the permanent bond, and bumps, wire bonds, or other method of electrical contact can be made to the top-side contacts.

Alternatively, if openings in the top surface are created before temporarily bonding the inert carrier, electrical connection can be provided and device functionality can be tested before proceeding with subsequent processing steps. After etching openings in the surface and forming conductive bumps, or another method of electrical connection, the carrier can then be temporarily bonded to the surface and the fabrication process is continued as described above.

In accordance with another embodiment, a method for fabricating the preferred structure follows similar steps as the method according to the first embodiment. Instead of depositing the neutron conversion layer onto the exposed buried oxide surface, in this embodiment the neutron conversion layer is deposited directly onto the second substrate. A permanent bond is then formed between the coated substrate and the thin supported device layer by utilizing the adhesiveness of the doped spin-on conversion layer. A second adhesive layer could also be placed between the buried oxide surface and the coated substrate to form the wafer-to-wafer bond.

Figure 1:
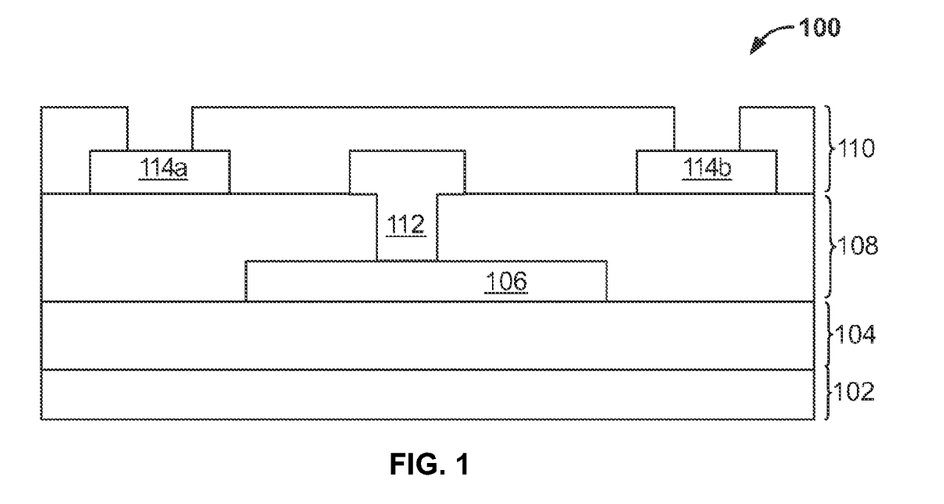
FIG. 1 illustrates a passivated device wafer, according to an embodiment of the present invention.

FIG. 1 illustrates a passivated device wafer 100, according to a first embodiment of the present invention. The wafer 100 may be a completed integrated circuit wafer, such as one containing one or more Static Random Access Memory (SRAM) elements and/or other circuitry. The example shown in FIG. 1 is a SOI device wafer.

The wafer 100 includes a first substrate 102 (i.e. a "handle" wafer) that is preferably bulk silicon. An insulator, such as buried oxide (BOX layer) 104 overlies the first substrate 102. A device layer 106 overlies the BOX layer 104 and is appropriately patterned to provide much of the device functionality (e.g. SRAM cell(s)/array(s)). The device layer 106 is preferably silicon and overlies a silicon-dioxide BOX layer 104, which together serve as the basic SOI structure. An isolation layer 108 partially or completely surrounds the sides and upper surface(s) of the device layer 106. A passivation layer 110 overlies the isolation layer 108. As illustrated, a contact 112 (e.g. a metallization) may provide electrical connectivity to the device layer 106 from the passivation layer 112. In addition, openings have been etched to provide access to top-side contacts 114a-b (shown as metallizations, but could comprise metal lines or conductive leads) that couple to the device layer 106. Conductive bumps, or another method of electrical contact, can be formed on contacts 114a-b at this stage, though not shown here. Openings can instead be etched after the carrier is removed, shown in FIG. 8. The general structure of wafer 100 serves as a starting point in manufacturing a neutron detector in accordance with embodiments of the present invention.

Figure 2:
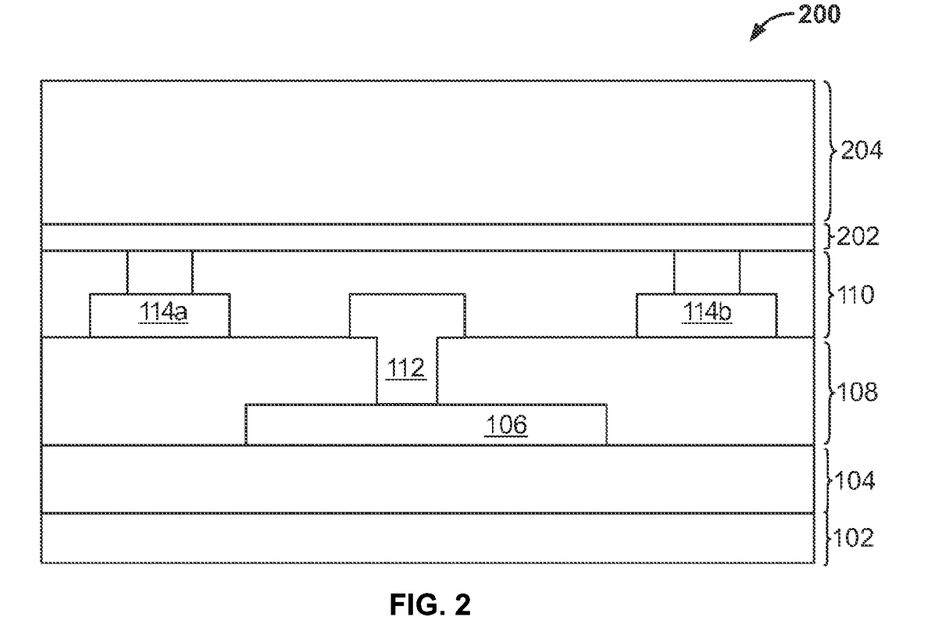
FIG. 2 illustrates a structure corresponding to the passivated device wafer at a subsequent state of processing, according to an embodiment of the present invention.

FIG. 2 illustrates a structure 200 corresponding to the passivated device wafer 100 at a subsequent state of processing, according to the first embodiment of the present invention. An adhesion layer 202 temporarily bonds the passivated circuit wafer 100 to a carrier 204, forming a device wafer with a sacrificial carrier. A well-known low-temperature bonding process is preferably used which includes bonding agents such as wax, dissolvable glues, or thermally releasable adhesive tapes. Bonding temperatures should be limited to or around 350° C.

Figure 3:
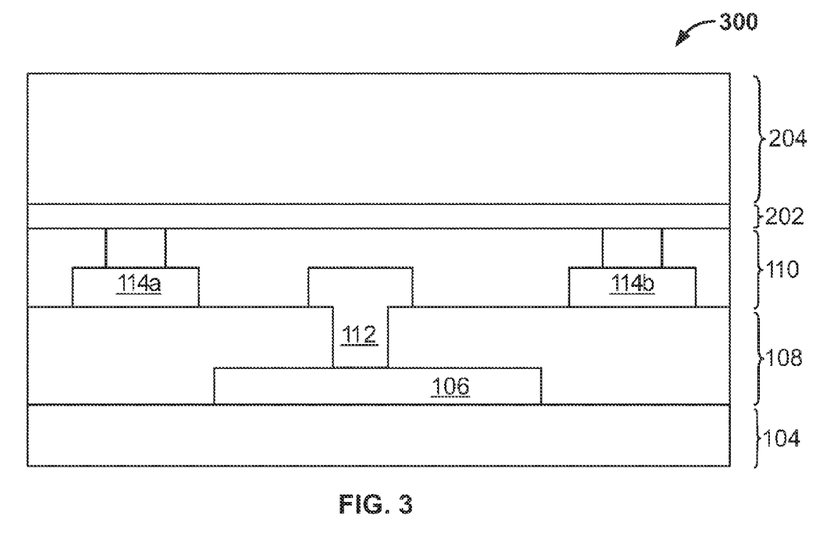
FIG. 3 illustrates the structure of FIG. 2 at a subsequent stage of processing, according to an embodiment of the present invention.

FIG. 3 illustrates a structure 300 corresponding to the structure 200 of FIG. 2 at a subsequent stage of processing, according to the first embodiment of the present invention. The first substrate 102 (the handle wafer) has been removed. Removal may include grinding, polishing, and etching off the handle wafer. Other removal techniques may also be used. Alternatively, a "debondable" SOI wafer could be used to isolate the thin device layer 106. Such a debonded SOI wafer would allow one to transfer the active device layer onto a suitable carrier. Debondable SOI wafers have been described and offered by Tracit, a subsidiary of SOITEC, based in Bernin, France.

Figure 4:
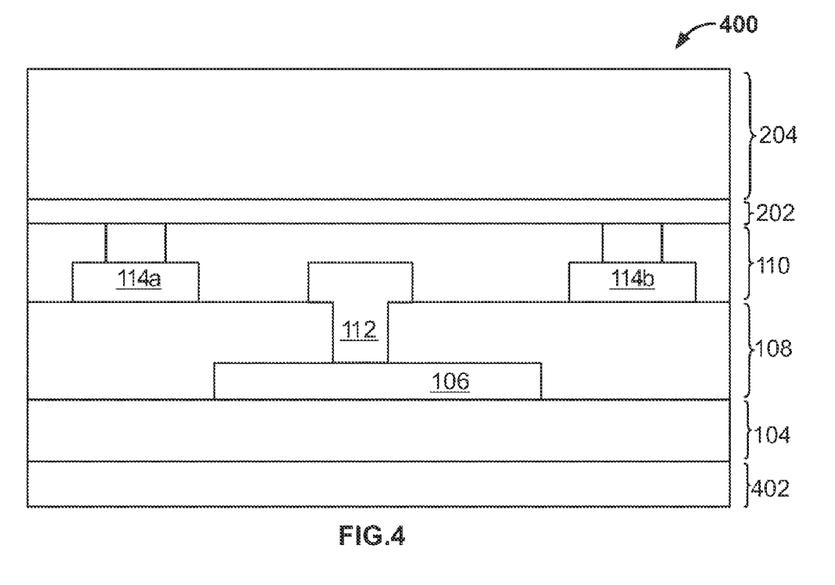
FIG. 4 illustrates the structure of FIG. 3 at a subsequent stage of processing, according to an embodiment of the present invention.

FIG. 4 illustrates a structure 400 corresponding to the structure 300 of FIG. 3 at a subsequent stage of processing, according to the first embodiment of the present invention. A neutron detection layer 402 is deposited on the BOX layer 104, such as opposite the device layer 106. The neutron detection layer 402 is preferably a boron-doped spin-on dielectric layer that converts incident neutrons into charged particles. At least some of the charged particles are received at the device layer 106 and cause single event upsets (SEUs) that may be perceived as bit changes (e.g. in an SRAM in the device layer 106). The doped spin-on dielectric layer 402 also acts as an adhesive layer for the subsequent permanent bonding of a new substrate. In addition to a boron-doped spin-on conversion layer, other types of neutron detection layers, such as the ones described in U.S. Pat. Nos. 6,867,444 and 7,271,389, may alternatively be used.

Figure 5:
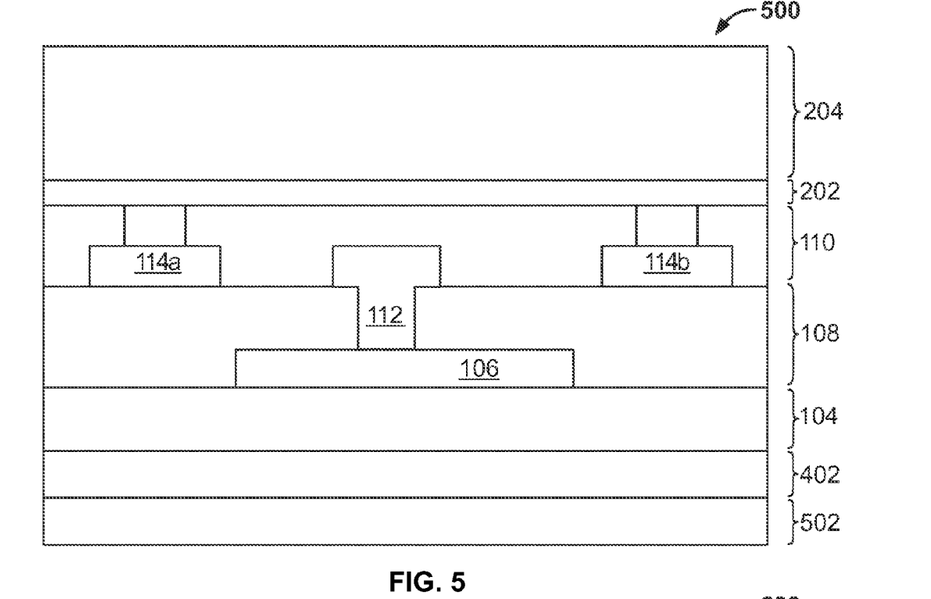
FIG. 5 illustrates the structure of FIG. 4 at a subsequent stage of processing, according to a first embodiment of the present invention.

FIG. 5 illustrates a structure 500 corresponding to the structure 400 of FIG. 4 at a subsequent stage of processing, according to the first embodiment of the present invention. A second substrate 502 is permanently bonded to the conversion layer 402. The uncured spin-on conversion layer 402 acts like an adhesive to form the wafer-to-wafer bond when the second substrate 502 is brought into contact with it. An equivalent structure can be formed by depositing the doped spin-on conversion layer 402 onto a second substrate 502, forming a coated substrate, and then bringing the coated substrate into contact with the BOX layer 104.

Figure 6:
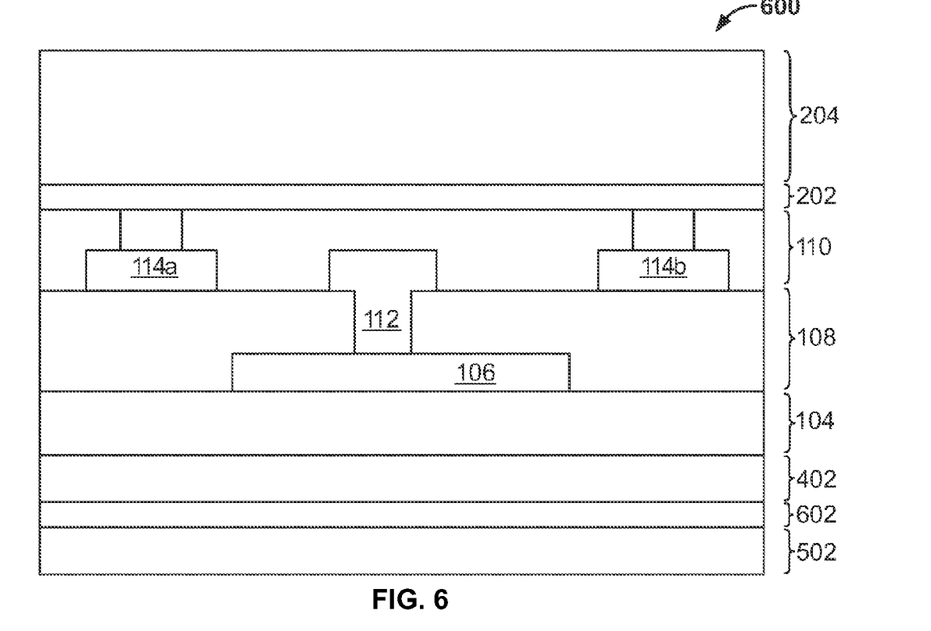
FIG. 6 illustrates the structure of FIG. 4 at a subsequent stage of processing, according to a second embodiment of the present invention.

FIG. 6 illustrates a structure 600 corresponding to the structure 400 of FIG. 4 at a subsequent stage of processing, according to a second embodiment of the present invention. To form the wafer-to-wafer bond, a second doped or undoped adhesive layer such as an epoxy 602 can be placed between the conversion layer 402 and the second substrate 502 before the two are brought into contact.

Figure 7:
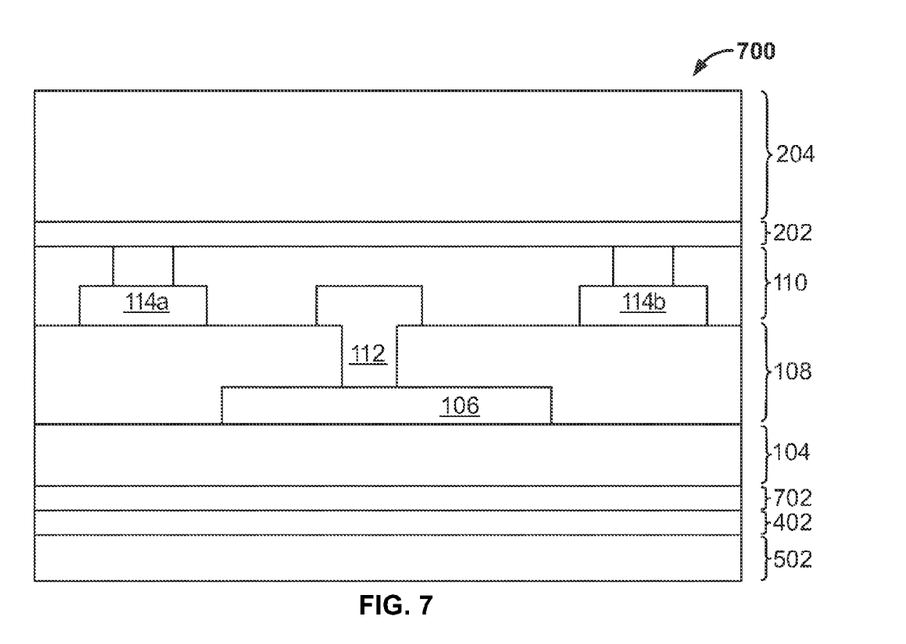
FIG. 7 illustrates the structure of FIG. 3 at a subsequent stage of processing, according to a third embodiment of the present invention.

FIG. 7 illustrates a structure 700 corresponding to the structure 300 of FIG. 3 at a subsequent stage of processing, according to a third embodiment of the present invention. The conversion layer 402 is first deposited onto the second substrate 502 forming a coated substrate. Second, a doped or undoped adhesive layer 702, such as epoxy, is deposited on the BOX layer 104. Third, the coated substrate is brought into contact with the adhesive layer 702. In this case, care should be taken to assure that the thickness of the adhesive layer 702 does not exceed that of about 1 micron so as to not attenuate the flux of the alpha particles created in the conversion layer. Alternative steps can be taken as well to reach the same end structure 700 such as applying the adhesive layer 702 to the BOX layer 104, subsequently depositing the conversion layer 402 to the adhesive layer 702, and bonding the second substrate 502 to the conversion layer 402. Or, the adhesive layer 702 can be applied to the substrate 502 after it is coated with the conversion layer 402. The coated substrate with adhesive can then be brought into contact with the BOX layer 402. In any method, the temperature at which the second substrate 502 is permanently bonded to the structure 300 stays at or below 350° C. so as to not disturb the temporary bond of the carrier 204.

Figure 8:
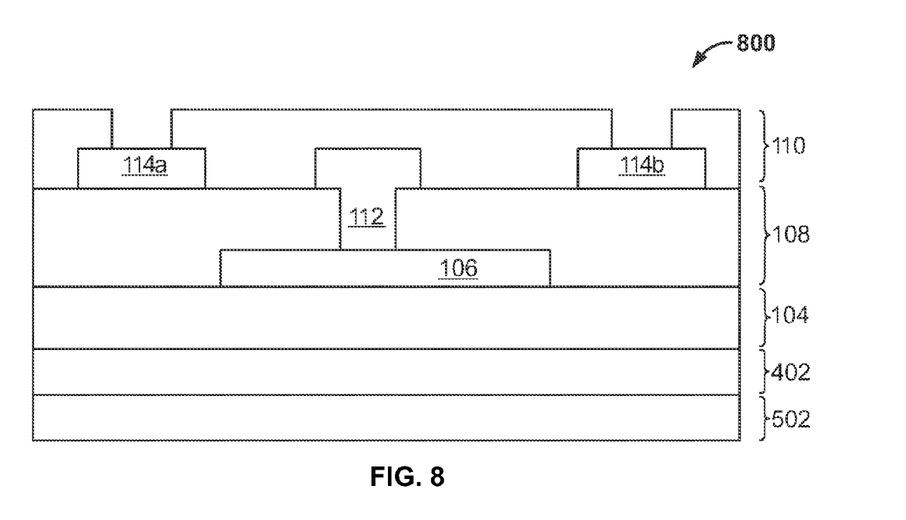
FIG. 8 illustrates the structure of FIG. 5 at a subsequent stage of processing, according to the first embodiment of the present invention.

FIG. 8 illustrates a structure 800 corresponding to the structure 500 of FIG. 5 at a subsequent stage of processing, according to the first embodiment of the present invention. The carrier wafer is removed by breaking the temporary bond between the carrier and the passivation layer 110. Well known removal techniques are used including washing the device with an organic solvent, or heating the device above 350° C. Heating can be accomplished through infrared radiation or another well known heating method. Once the carrier is removed, the structure may be cured to solidify the permanent bonds. If not completed already, openings can be etched and electrical connection may then be made to the exposed top-side contacts 114a-b. Though this stage of processing is only shown corresponding to the structure 500 of FIG. 5, according to the first embodiment, it is understood that it could correspond to a subsequent stage of processing according to the other embodiments as well.

Figure 9:
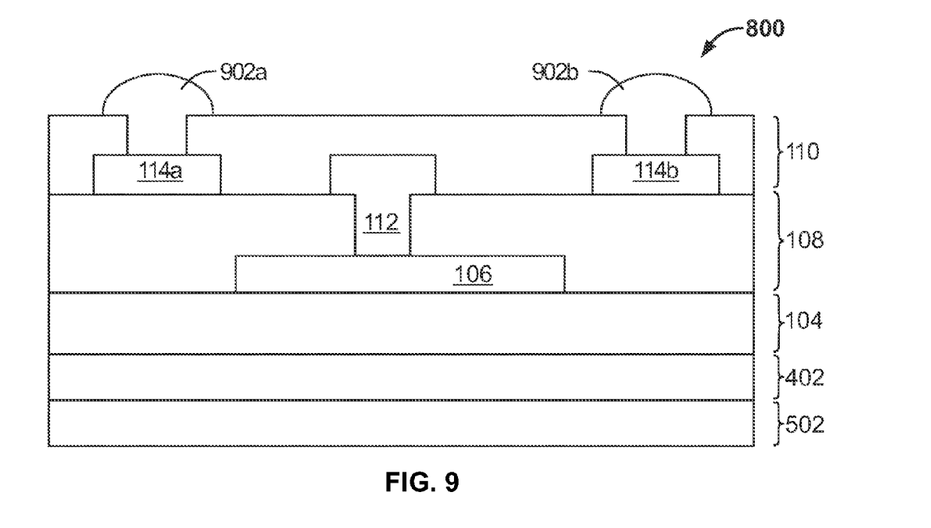
FIG. 9 illustrates the structure of FIG. 8 at a subsequent stage of processing, according to the first embodiment of the present invention.

FIG. 9 illustrates the structure 800 of FIG. 8 at a subsequent stage of processing, according to the first embodiment of the present invention. Conductive bumps 902a-b have been formed on the top-side contacts 114a-b. The conductive bumps 902a-b may comprise gold, nickel, palladium, copper, silver, aluminum, tungsten, various alloys, solder, and/or conductive epoxy, for example. Other conductive materials may also be used for the conductive bumps 902a-b. The conductive bumps 902a-b may be used to make contact with bond pads on a circuit board, for example. As shown, the conductive bumps 902a-b preferably protrude beyond the surface of the passivation layer 110. The bumps 902a-b could also have been formed before the carrier 204 was temporarily bonded to the passivation layer 110. Though this stage of processing is only shown corresponding to the structure 800 of FIG. 8, according to the first embodiment, it is understood that it could correspond to a subsequent stage of processing according to the other embodiments as well.

Figure 10:
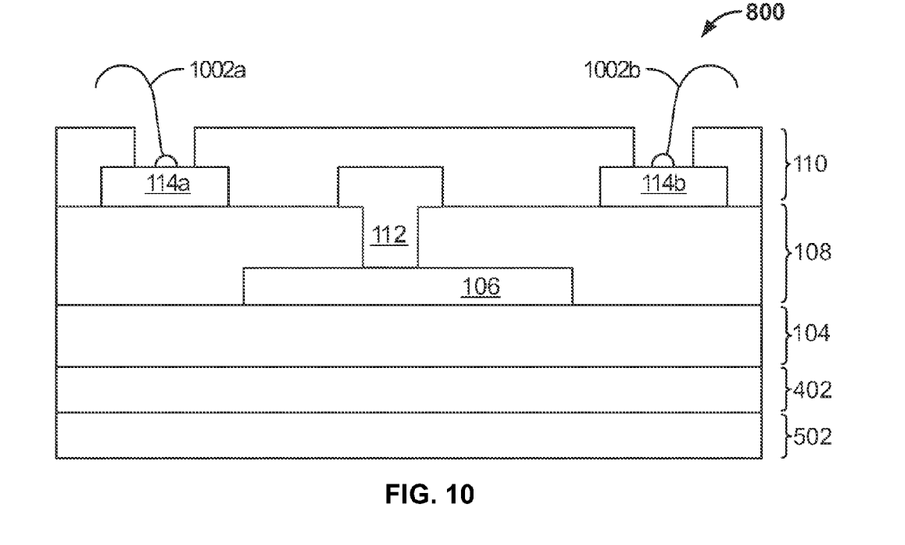
FIG. 10 illustrates the structure of FIG. 8 at a subsequent stage of processing, according to another embodiment of the present invention.

FIG. 10 illustrates the structure 800 of FIG. 8 at a subsequent stage of processing according to another embodiment of the present invention. Wire bonds 1002a-b have been secured to and placed in electrical contact with the top-side contacts 114a-b. The wire bonds 1002a-b can then be connected as appropriate to other circuitry (such as on a circuit board, for example). Such other circuitry could include a counting circuit for counting the number of radiation events detected by the neutron detection layer 402 and stored by the SRAM in the device layer 106, for example. In an alternative embodiment, additional packaging could surround the structure 800 shown in FIG. 10, with the wire bonds 1002a-b making direct or indirect contact (e.g. by connecting to other conductive leads associated with the packaging). Though this stage of processing is only shown corresponding to the structure 800 of FIG. 8, according to the first embodiment, it is understood that it could correspond to a subsequent stage of processing according to the other embodiments as well.

Figure 11:
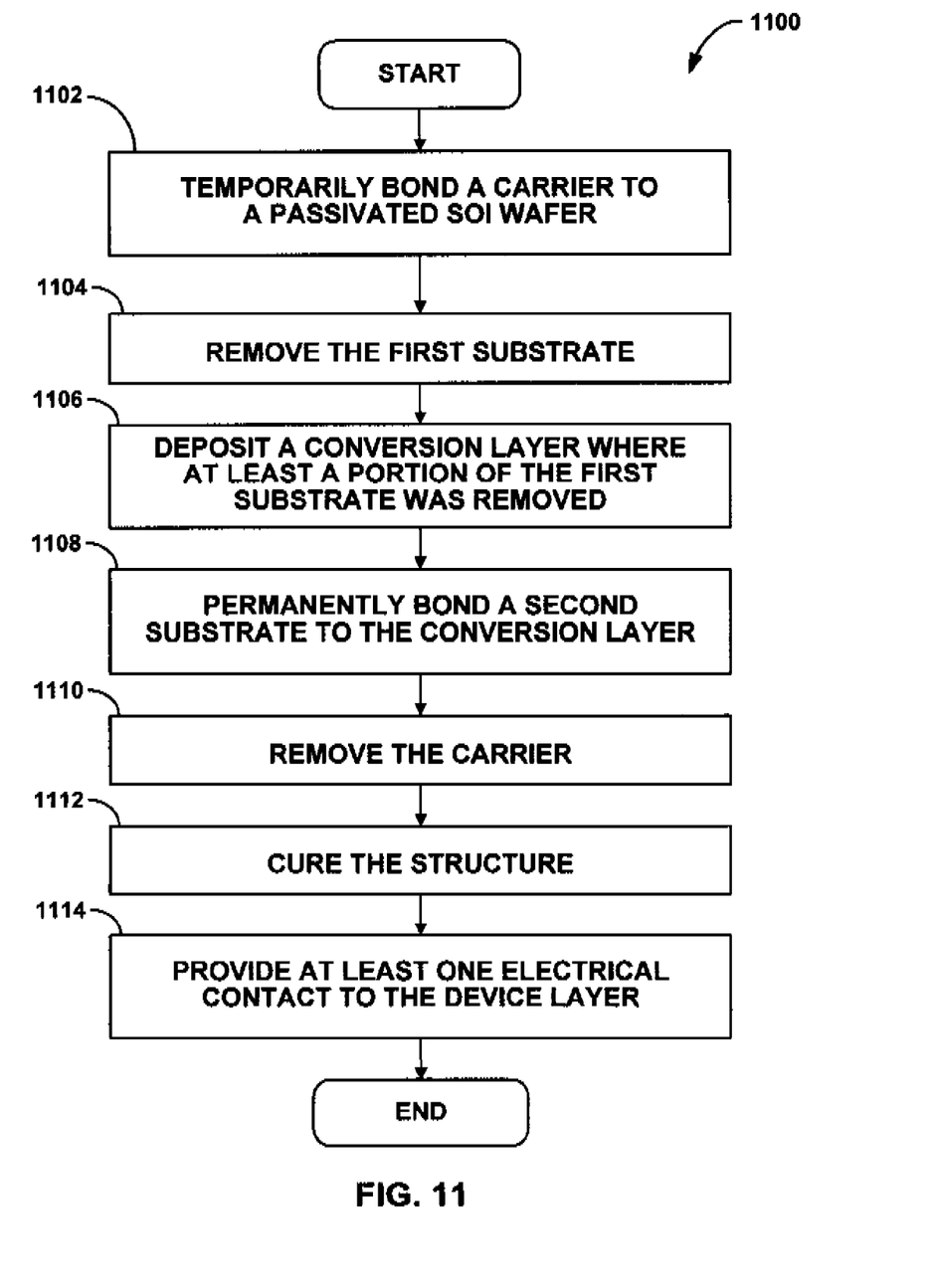
FIG. 11 illustrates a method 1100 for fabricating a neutron detection structure in accordance with an embodiment of the present invention.

FIG. 11 illustrates a method 1100 for fabricating a neutron detection structure in accordance with an embodiment of the present invention. The method 1100 includes, at block 1102, temporarily bonding a carrier to a passivated SOI SRAM wafer. The passivated SOI SRAM wafer has a device layer, a buried oxide layer, and a substrate, such as an insulative substrate or semiconductor substrate. In block 1104, the first substrate is removed and in block 1106, a conversion layer is deposited where at least a portion of the substrate was removed. In block 1108, a second substrate is permanently bonded to the conversion layer and in block 1110 the carrier is removed. In block 1112, the structure is cured to solidify the adhesive layers and in block 1114, at least one method of electrical contact is provided to the device layer.

Removing the first substrate (block 1104) may be performed by grinding, polishing, and/or etching off the substrate (handle wafer) or it could instead be performed by debonding a commercially available debondable SOI wafer (for example, of the kind discussed above from SOITEC). Removing the carrier (block 1110) can be achieved by breaking the temporary bond (through methods discussed above). Curing (block 1112) preferably takes place in the range from 300° C. to 400° C. The at least one electrical contact (block 1114) could be a conductive bump attached to top-side contacts or a wire bond coupled to top-side contacts, for example. As described above, in an alternative embodiment, providing at least one electrical contact (block 1114) can be moved to the beginning and executed as the first step.

Figure 12:
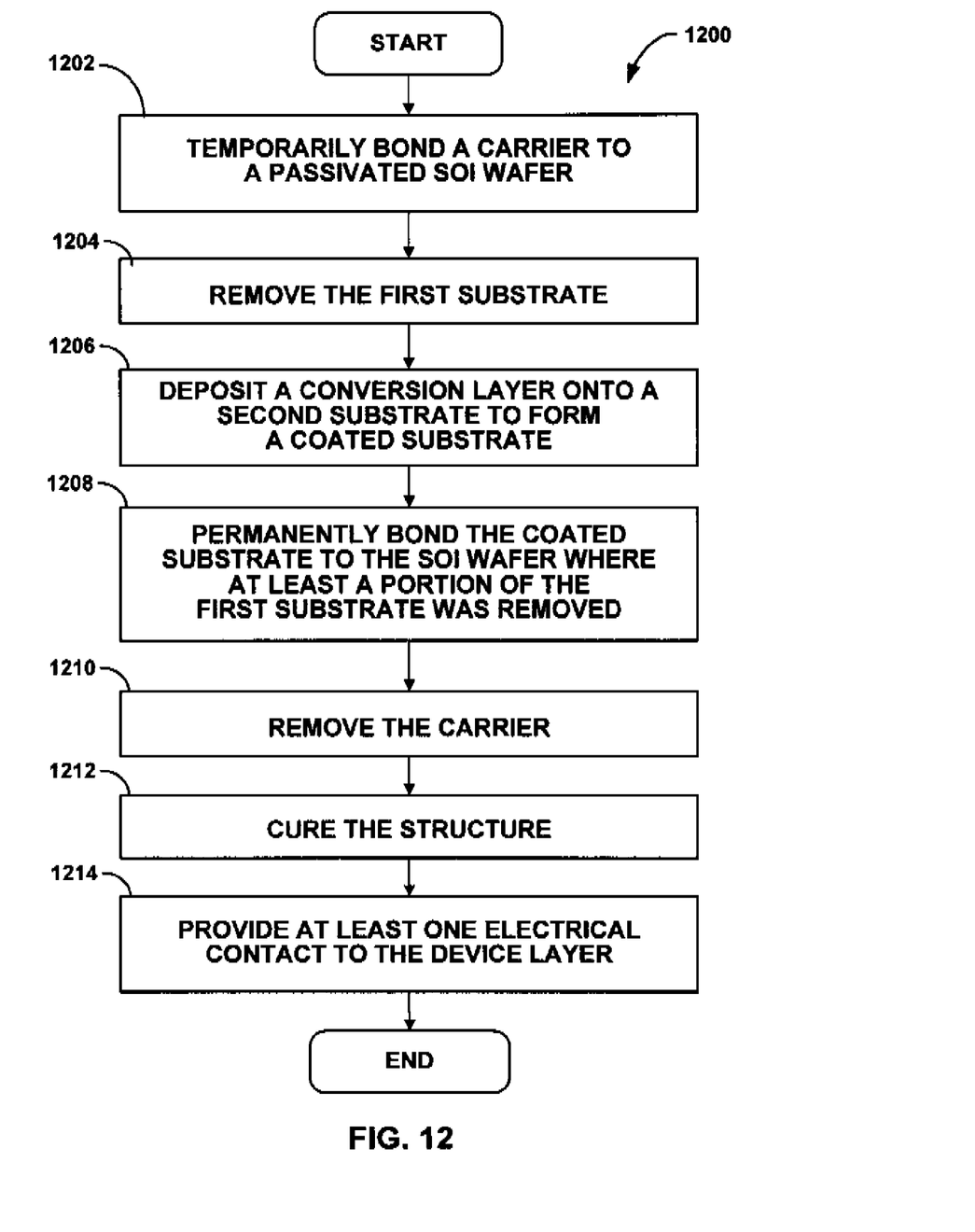
FIG. 12 illustrates a method 1200 for fabricating a neutron detection structure in accordance with an embodiment of the present invention.

FIG. 12 illustrates a method 1200 for fabricating a neutron detection structure in accordance with another embodiment of the present invention. The method 1200 includes, at block 1202, temporarily bonding a carrier to a passivated SOI SRAM wafer. The passivated SOI SRAM wafer has a device layer, a buried oxide layer, and a substrate, such as an insulative substrate or semiconductor substrate. In block 1204, the first substrate is removed and in block 1206, a conversion layer is deposited onto a second substrate to form a coated substrate. In block 1208, the coated substrate is permanently bonded to the SOI SRAM wafer where at least a portion of the first substrate was removed. In block 1210 the carrier is removed and in block 1212, the structure is cured to solidify the adhesive layers. Finally in block 1214, at least one method of electrical contact is provided to the device layer.

Permanently bonding the substrate to the SOI SRAM wafer (block 1208) may comprise providing an adhesive layer either directly between the BOX layer 104 and the coated substrate or directly between the conversion layer 402 (after it has been deposited onto the BOX layer 104) and the substrate 502. As described above, in an alternative embodiment, providing at least one electrical contact (block 1214) can be moved to the beginning and executed as the first step.

The structure and method set forth above are not limited to any particular application described herein. The embodiments illustrated in FIGS. 1-10 are not drawn to scale, but are instead intended to effectively illustrate intermediate structure stages during manufacture of the neutron detection device.

Various arrangements and embodiments in accordance with the present invention have been described herein. It will be appreciated, however, that those skilled in the art will understand that changes and modifications may be made to these arrangements and embodiments as well as combination of the various embodiments without departing from the true scope and spirit of the invention, which is defined by the following claims.

I claim:

1. A method for fabricating a neutron detection structure, the method comprising:
   temporarily bonding a carrier to a passivated silicon-on-insulator (SOI) Static Random Access Memory (SRAM) wafer, the passivated SOI SRAM wafer comprising a device layer, a buried oxide layer, and a first substrate;
   removing the first substrate;
   depositing a conversion layer where at least a portion of the first substrate was removed;
   permanently bonding a second substrate to the conversion layer;
   removing the carrier; and
   providing at least one electrical contact to the device layer.

2. The method of claim 1, further comprising curing the structure.

3. The method of claim 1, wherein temporarily bonding the carrier to the passivated SOI SRAM wafer comprises using a low temperature adhesive.

4. The method of claim 1, wherein the device layer includes a Static Random Access Memory (SRAM) device.

5. The method of claim 1, wherein removing the first substrate comprises debonding a commercially available debondable SOI wafer.

6. The method of claim 1, wherein the conversion layer comprises a boron doped spin-on dielectric layer.

7. The method of claim 1, wherein permanently bonding the second substrate comprises placing an adhesive layer between the conversion layer and the second substrate which are then placed in contact.

8. The method of claim 1, wherein depositing the conversion layer comprises:
   placing an adhesive layer between the buried oxide layer and the conversion layer; and adhering the buried oxide layer to the conversion layer by pressing.

9. A method for fabricating a neutron detection structure, the method comprising:
   temporarily bonding a carrier to a passivated silicon-on-insulator (SOI) Static Random Access Memory (SRAM) wafer, the passivated SOI SRAM wafer comprising a device layer, a buried oxide layer, and a first substrate;
   removing the first substrate;
   depositing a conversion layer onto a second substrate forming a coated substrate;
   permanently bonding the coated substrate where at least a portion of the first substrate was removed;
   removing the carrier; and
   providing at least one electrical contact to the device layer.

10. The method of claim 9, further comprising curing the structure.

11. The method of claim 9, wherein temporarily bonding the carrier to the passivated SOI SRAM wafer comprises using a low temperature adhesive.

12. The method of claim 9, wherein the device layer includes a Static Random Access Memory (SRAM) device.

13. The method of claim 9, wherein removing the first substrate comprises debonding a commercially available debondable SOI wafer.

14. The method of claim 9, wherein the conversion layer comprises a boron doped spin-on dielectric layer.

15. The method of claim 9, wherein depositing the conversion layer comprises:
   placing an adhesive layer between the conversion layer and the second substrate; and adhering the conversion layer to the second substrate by pressing.

16. The method of claim 9, wherein permanently bonding the coated substrate comprises:
   placing an adhesive layer between where at least a portion of the first substrate was removed and the coated substrate; and adhering the SOI SRAM wafer and the coated substrate by pressing.

17. A method for fabricating a neutron detection structure, the method comprising:
   temporarily bonding a carrier to a passivated silicon-on-insulator (SOI) Static Random Access Memory (SRAM) wafer, the passivated SOI SRAM wafer comprising a device layer, a buried oxide layer, and a first substrate;
   removing the first substrate;
   placing a boron doped spin-on dielectric layer between where at least a portion of the first substrate was removed and a second substrate;
   bringing the SOI SRAM wafer and the second substrate together;
   removing the carrier; and
   providing at least one electrical contact to the device layer.

18. The method of claim 17, further comprising curing the structure.

19. The method of claim 17, wherein placing the dielectric layer comprises depositing the dielectric layer onto the buried oxide layer.

20. The method of claim 17, wherein placing the dielectric layer comprises depositing the dielectric layer onto the second substrate.

* * * * *